(12) United States Patent
Lee et al.

(10) Patent No.: US 6,740,884 B2
(45) Date of Patent: May 25, 2004

(54) IMAGING ARRAY AND METHODS FOR FABRICATING SAME

(75) Inventors: Ji Ung Lee, Niskayuna, NY (US); Douglas Albagli, Clifton Park, NY (US); George Edward Possin, Niskayuna, NY (US); Ching-Yeu Wei, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 127 days.

(21) Appl. No.: 10/116,469

(22) Filed: Apr. 3, 2002

(65) Prior Publication Data

US 2003/0189175 A1 Oct. 9, 2003

(51) Int. Cl.[7] ............................................... H01L 21/00
(52) U.S. Cl. ........................... 250/370.08; 250/370.09; 257/386
(58) Field of Search ................ 250/370.08, 370.09, 250/580, 374, 370.14, 370.13, 370.11, 338.4, 208.1, 214.1; 257/291, 386, 389

(56) References Cited

U.S. PATENT DOCUMENTS

| | | | |
|---|---|---|---|
| 4,725,890 A | 2/1988 | Yaniv et al. | |
| 4,739,414 A | 4/1988 | Pryor et al. | |
| 4,889,983 A | 12/1989 | Numano et al. | |
| 5,202,575 A | 4/1993 | Sakai | |
| 5,349,174 A | * 9/1994 | Van Berkel et al. | 250/208.1 |
| 5,399,884 A | 3/1995 | Wei et al. | |
| 5,435,608 A | 7/1995 | Wei et al. | |
| 5,480,810 A | 1/1996 | Wei et al. | |
| 5,517,031 A | * 5/1996 | Wei et al. | 250/370.08 |
| 5,532,180 A | 7/1996 | den Boer et al. | |
| 5,552,909 A | * 9/1996 | Onisawa et al. | 349/42 |
| 5,587,591 A | 12/1996 | Kingsley et al. | |
| 5,610,403 A | 3/1997 | Kingsley et al. | |
| 5,610,404 A | 3/1997 | Possin | |
| 5,614,727 A | 3/1997 | Mauri et al. | |
| 5,631,473 A | 5/1997 | Possin et al. | |
| 5,648,654 A | 7/1997 | Possin | |
| 5,736,732 A | 4/1998 | Possin et al. | |
| 5,777,355 A | 7/1998 | Possin et al. | |
| 5,818,053 A | 10/1998 | Tran | |
| 5,838,054 A | 11/1998 | Kwasnick et al. | |
| 5,869,837 A | 2/1999 | Huang | |
| 5,920,070 A | 7/1999 | Petrick et al. | |
| 5,942,756 A | 8/1999 | Tran | |
| 6,025,599 A | 2/2000 | Lee et al. | |
| 6,031,234 A | 2/2000 | Albagli et al. | |
| 6,075,248 A | * 6/2000 | Jeromin et al. | 250/370.09 |
| 6,124,606 A | * 9/2000 | den Boer et al. | 257/291 |
| 6,133,614 A | 10/2000 | Shoji et al. | |
| 6,167,110 A | 12/2000 | Possin et al. | |
| 6,243,441 B1 | 6/2001 | Zur | |
| 6,262,421 B1 | 7/2001 | Tran | |
| 6,490,014 B1 | * 12/2002 | Ohtani et al. | 349/38 |
| 6,559,506 B1 | * 5/2003 | Lee et al. | 257/350 |

* cited by examiner

Primary Examiner—Constantine Hannaher
Assistant Examiner—Otilia Gabor
(74) Attorney, Agent, or Firm—Armstrong Teasdale LLP

(57) ABSTRACT

A radiation detector includes a top gate thin film transistor (TFT) including a source electrode, a drain electrode, a gate electrode, a first dielectric layer, and a second dielectric layer, wherein the second dielectric layer is extending over a surface of the first dielectric layer. The radiation detector also includes a capacitor that includes at least two electrodes and a dielectric layer. The capacitor dielectric layer is formed unitarily with the TFT second dielectric layer.

45 Claims, 4 Drawing Sheets

IMAGING ARRAY AND METHODS FOR FABRICATING SAME

BACKGROUND OF THE INVENTION

This invention relates generally to imaging arrays, and more particularly, to pixel formations for imaging arrays.

Imaging arrays typically include a photosensor array coupled to a scintillating medium. Radiation absorbed in the scintillator generates optical photons which in turn pass into a photosensor, such as a photodiode. The photon is absorbed in the photosensor and an electrical signal corresponding to an incident photon flux is generated. Hydrogenated amorphous silicon (a-Si:H) is commonly used in the fabrication of photosensors due to advantageous photoelectric characteristics of a-Si:H and a relative ease of fabricating such devices. In particular, photosensitive elements, such as photodiodes, can be formed in connection with necessary control or switching elements, such as thin film transistors (TFTs), in a relatively large array. Radiation detectors and display arrays are typically fabricated on a large substrate on which many components, including TFTs, address lines, capacitors, and devices such as photosensors, are formed through the deposition and patterning of layers of conductive, semiconductive, and insulative materials.

At least one known fabrication process for such a TFT array typically includes fabricating a bottom gate TFT and data and scan address lines. In some known bottom gate TFT's, the bottom gate metal shields a channel region, i.e. acts as a light blocking element, blocking light from a back light. The light blocking layer is desirable since photons can create an undesirable leakage in the TFT. For example, in a digital X-ray panel, the light is created from the scintillator that is deposited on the top of the devices, therefore the TFT regions are directly exposed to the photons. Therefore, an additional light blocking layer, requiring an additional photolithography level, is therefore necessary to shield the TFT channel region from undesirable light.

BRIEF SUMMARY OF THE INVENTION

In one aspect, a radiation detector that includes a top gate thin film transistor (TFT) including a source electrode, a drain electrode, a gate electrode, a first dielectric layer, and a second dielectric layer is provided. The second dielectric layer is extending over a surface of the first dielectric layer. The radiation detector also includes a capacitor that includes at least two electrodes and a dielectric layer. The capacitor dielectric layer is formed unitarily with the TFT second dielectric layer.

In another aspect, a method for fabricating a radiation detector that includes forming a top gate thin film transistor (TFT) including a source electrode, a drain electrode, a gate electrode, a first dielectric layer, and a second dielectric layer is provided. The second dielectric layer is extending over a surface of the first dielectric layer. The method also includes forming a capacitor including at least two electrodes and a dielectric layer. The capacitor dielectric layer is formed unitarily with the TFT second dielectric layer.

In yet another aspect, an imaging system including a radiation source and a radiation detector is provided. The radiation detector includes a top gate thin film transistor (TFT) including a source electrode, a drain electrode, a gate electrode, a first dielectric layer, and a second dielectric layer. The second dielectric layer is extending over a surface of the first dielectric layer. The radiation detector also includes a capacitor including at least two electrodes and a dielectric layer. The capacitor dielectric layer is formed unitarily with the TFT second dielectric layer.

DETAILED DESCRIPTION OF THE INVENTION

Figure 1:
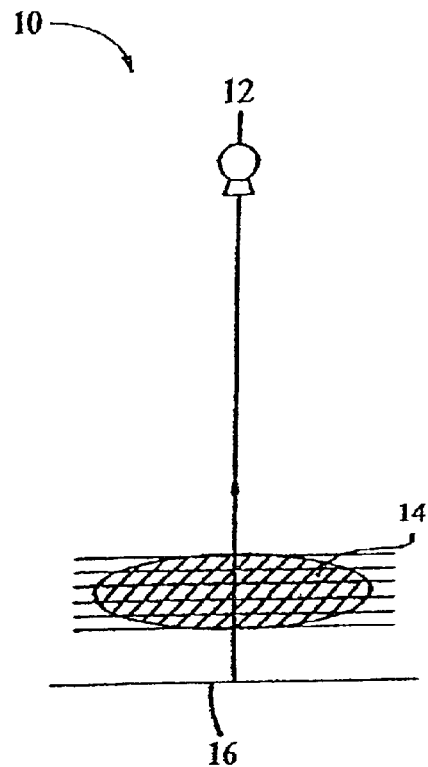
FIG. 1 is a pictorial view of an imaging system.

FIG. 1 is a pictorial view of an imaging system 10. In one embodiment imaging system 10 is a medical imaging system, such as, but not limited to, a Sennovision 2000D which is commercially available from the GE Medical Systems business of General Electric Corporation, Milwaukee, Wis. Imaging system 10 includes a radiation source 12 which projects a cone-shaped beam. In one embodiment, radiation source 12 is an x-ray source 12, the cone-shaped beam is an x-ray beam. The X-ray beam passes through an object 14, i.e. an object being imaged such as a patient. The X-ray beam, after being attenuated by object 14, impinges upon radiation detector 16.

Figure 2:
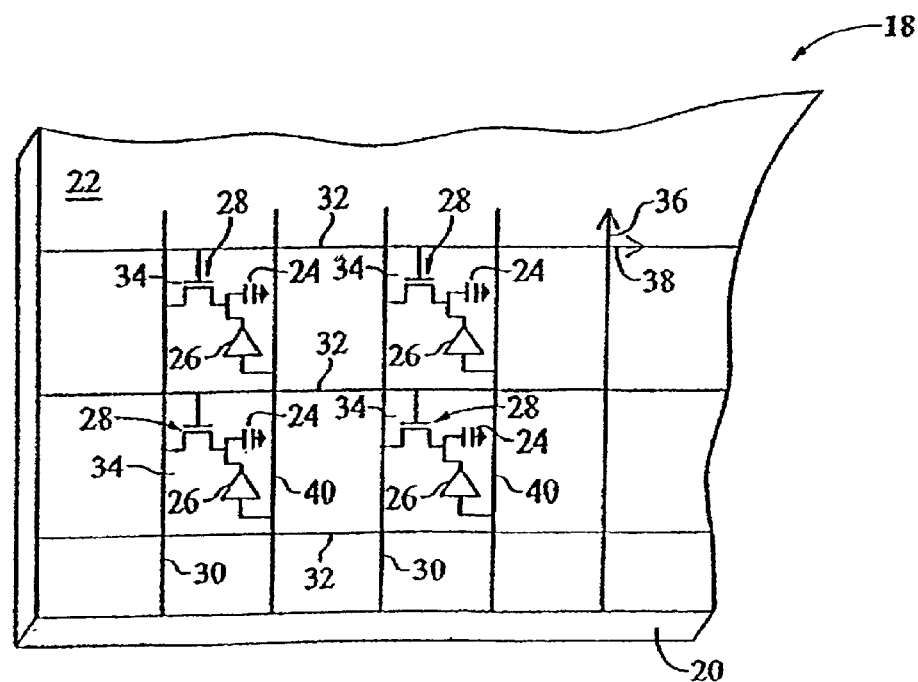
FIG. 2 is schematic illustration of a representative pixel in a photosensor array.

FIG. 2 is a radiation detector 18 that may be used with imaging system 10 (shown in FIG. 1). Radiation detector 18 includes a substrate 20 on which a pixel array 22 (sometimes called a photosensor array) is disposed. Photosensor array 22 includes a plurality of electronic components, such as capacitors 24, photodiodes 26, and switching devices 28, such as TFTs. TFTs 28 are disposed on array 22 to selectively couple a respective capacitor 24 and photodiode 26 to a respective data line 30. Photosensor array 22 also includes a plurality of scan lines 32 for addressing a plurality of individual pixels 34. Data lines 30 are oriented along a first axis 36 of pixel array 22, and scan lines 32 are oriented along a second axis 38 of pixel array 22. First and second axes, 36 and 38, of pixel array 22, are disposed substantially perpendicular to each other.

For ease of illustration in FIG. 2, only a few of data lines 30, scan lines 32, and common lines 40 are shown extending across photosensor array 22. Data lines 30, scan lines 32, and common lines 40 are arranged in rows and columns such that individual pixels 34 in photosensor array 22 are addressable by one data line 30, one scan line 32, and one common line 40. In one embodiment, data lines 30, scan lines 32, and common lines 40 include a conductive material, such as molybdenum, chromium, and/or aluminum. Capacitors 24 are electrically parallel connected to photodiodes 26, and are electrically coupled to data lines 30 through TFTs 28. Photodiodes 26 form the portion of array 22 that is responsive to incident photons and produce electric charge corresponding to a detected incident light. X-ray energy is converted to visible light energy by absorption in a layer of phosphor (not shown), such as cesium iodide, which is disposed near the surface of photodiodes 26. Capacitors 24 store a charge generated in photodiode 26 and discharge this stored charge through TFT 28 when scan line 32 is addressed. Some charge is also stored on the self-capacitance of the photo diode.

Figure 3:
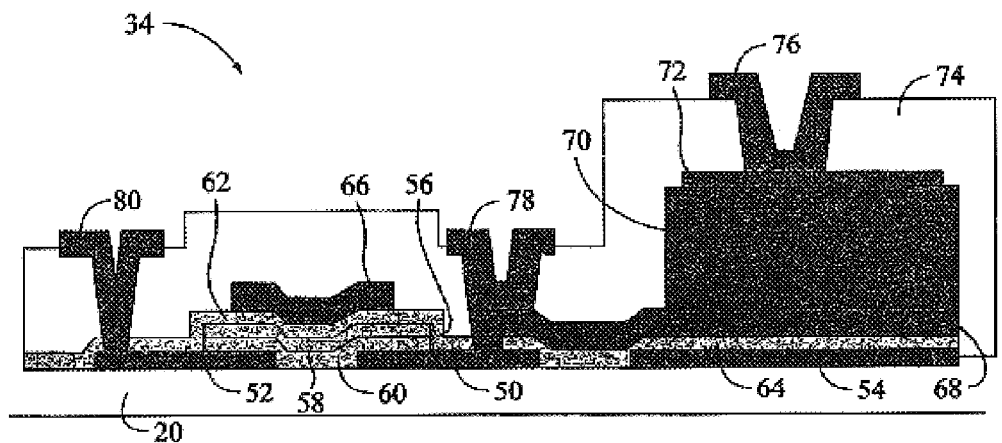
FIG. 3 is a cross-sectional view of a portion of a pixel of a radiation detector.

FIG. 3 is a cross-sectional view of a portion of pixel 34 formed on substrate 20. Pixel 34 includes a source electrode 50, a drain electrode 52, and a first capacitor electrode 54 extending over a surface of substrate 20 such that source electrode 50, drain electrode 52, and first capacitor electrode 54 are approximately equal in thickness.

A TFT stack 56 is formed on substrate 20. "TFT stack" as used herein, refers to a first dielectric layer 58 extending over a surface of a layer of semiconductive material 60, such as intrinsic amorphous silicon (a-Si). Intrinsic a-Si layer 60 is formed on and between source/drain electrodes 50, and 52. First dielectric layer 58 is formed over a-Si layer 60. As used herein, "formed" includes processes to fabricate each component of pixel 34, including, but not limited to, patterning, masking, depositing, and etching. In one embodiment, an n+ semiconductor layer (not shown) is formed adjacent to and on source and drain electrodes 50 and 52. The n+ semiconductor layer can be formed by one of several methods described herein. The n+ doped semiconductor layer is deposited, patterned, and etched to achieve the desired shape. In another embodiment, a suitable material such as indium tin oxide (ITO) is used to form source and drain electrodes 50 and 52. The ITO is then exposed to a phosphorous plasma or other active phosphorous containing gas, prior to deposition of substantially intrinsic amorphous silicon layer 60. After patterning and etching of TFT stack 56, a second dielectric layer 62 is formed on first dielectric layer 58, source electrode 50, drain electrode 52, and first capacitor electrode 54. Second dielectric layer 62 is formed unitarily with a storage capacitor dielectric layer 64. A gate electrode 66 is formed unitarily with scan line 32 (shown in FIG. 2), and a second capacitor electrode 68. A diode stack 70 is deposited on second capacitor electrode 68. In one embodiment, diode stack 70 includes a PIN diode (not shown). A PIN diode includes a layer of p+ material deposited on a layer of intrinsic a-Si which is deposited on a layer of n+ material. A diode top contact 72 is deposited, patterned, and etched on diode stack 70. A passivation layer 74 is formed over diode top contact 72, diode stack 70, and exposed portions of second dielectric layer 62, gate electrode 66, and second capacitor electrode 68. A plurality of contact vias are then opened in the dielectric at the desired locations. A common via 76, a source via 78, and a drain via 80 are formed such that common via 76 is electrically connected to diode top contact 72, drain via 80 is electrically connected to drain electrode 52, and source via 78 is electrically connected to source electrode 50 and capacitor electrode 68. A contact via is defined as a hole in the dielectric exposing a lower conductor. A via is defined as the entire structure including the metal layer and the contact via hole making contact to the lower conductor.

Figure 4:
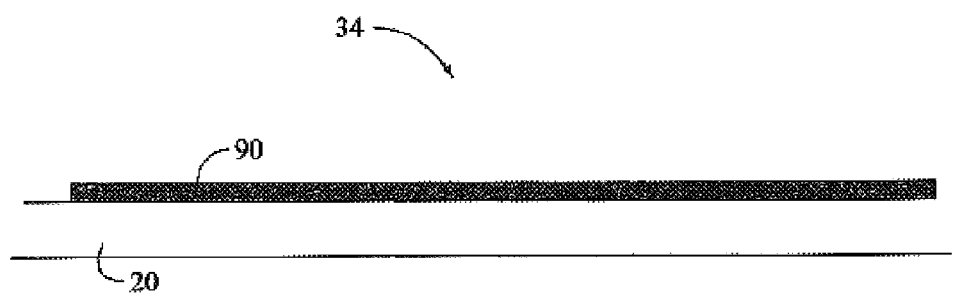
FIG. 4 is a cross-sectional view of a portion of the pixel shown in FIG. 3 during an initial fabrication stage.
Figure 5:
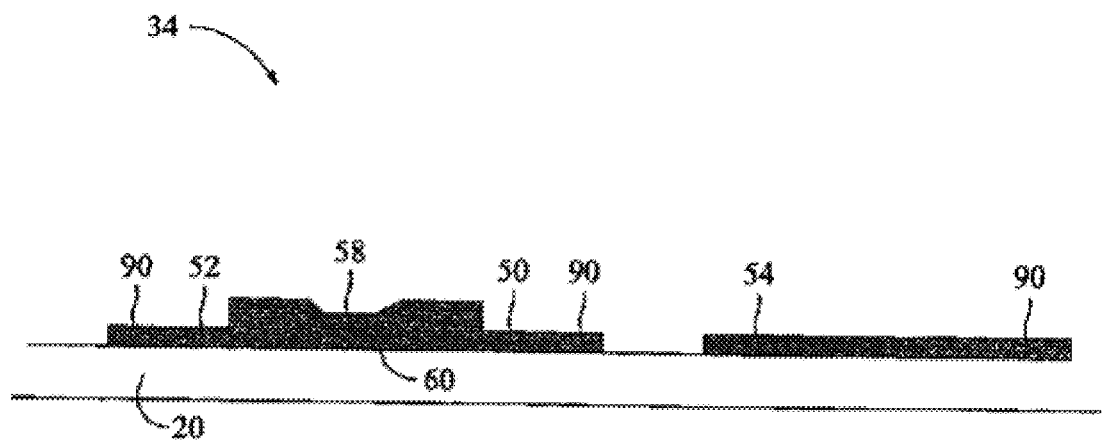
FIG. 5 is a cross-sectional view of a portion of the pixel shown in FIG. 3 during a first subsequent fabrication stage.

FIGS. 4 and 5 are cross-sectional views of a portion of pixel 34 shown in FIG. 3 during an initial fabrication stage and a first subsequent fabrication stage respectively. Semiconductor and dielectric layers are deposited by plasma enhanced chemical vapor deposition (PECVD). In one embodiment, a thin layer of n+ a-Si (not shown) is deposited, patterned and etched or co-deposited patterned and etched to form an n+ layer on top of source/drain electrodes 50 and 52. The n+ layer forms an ohmic electron contact and a blocking or non-injecting contact for holes. An ohmic contact facilitates supplying electron charge carriers to a semiconductor at a rate determined by charge transport through the semiconductor and not by the contact properties itself, therefore, current is limited by the conductivity of the semiconductor electron channel and not the contact. An ITO layer 90 is patterned and etched to expose source/drain electrodes 50, 52, and first capacitor electrode 54. The patterning process includes, but is not limited to, depositing a photoresist, exposing the photoresist in accordance with a desired pattern, and processing photoresist to remove portions thereof, leaving a mask having a selected pattern corresponding to desired dimensions.

In an exemplary embodiment, ITO layer 90 is used to form source and drain electrodes 50 and 52. Source electrode 50 and drain electrode 52, are selectively treated with a silicon dopant (not shown) such as, but not limited to, phosphine plasma, prior to depositing a-Si layer 60. Silicon dopant reacts with source electrode 50 and drain electrode 52 to selectively incorporate a phosphorous material (not shown) on the surface of source electrode 50 and drain electrode 52, and thereby modify TFTs 28 (shown in FIG. 2) electrical behavior and improve ohmic contact between source/drain electrodes 50, and 52 and a-Si layer 60. ITO absorbs some phosphorous and subsequently liberates this phosphorous into the adjacent regions of layer 60 producing an n+ doped semiconductor layer.

In one embodiment, a-Si layer 60 is deposited on source electrode 50 and drain electrode 52. In one embodiment, the thickness of a-Si layer 60 is between approximately 100 angstroms(Å) and approximately 3000 Å thick. In another embodiment, a-Si layer 60 is approximately 400 Å. Alternatively, a-Si layer 60 is between approximately 200 Å and approximately 600 Å thick. First dielectric layer 58 is deposited on a-Si layer 60. In one embodiment, the thickness of first dielectric layer 58 is between approximately 100 Å and approximately 500 Å thick. In another embodiment, dielectric layer 58 is approximately 400 Å thick. Alternatively, dielectric layer 58 is between approximately 50 Å and approximately 700 Å thick. First dielectric layer 60 includes, but is not limited to, SiN. First dielectric layer 58 and a-Si layer 60 are patterned and etched to form TFT stack 56. The etching process stops when ITO layer 90 is contacted.

Figure 6:
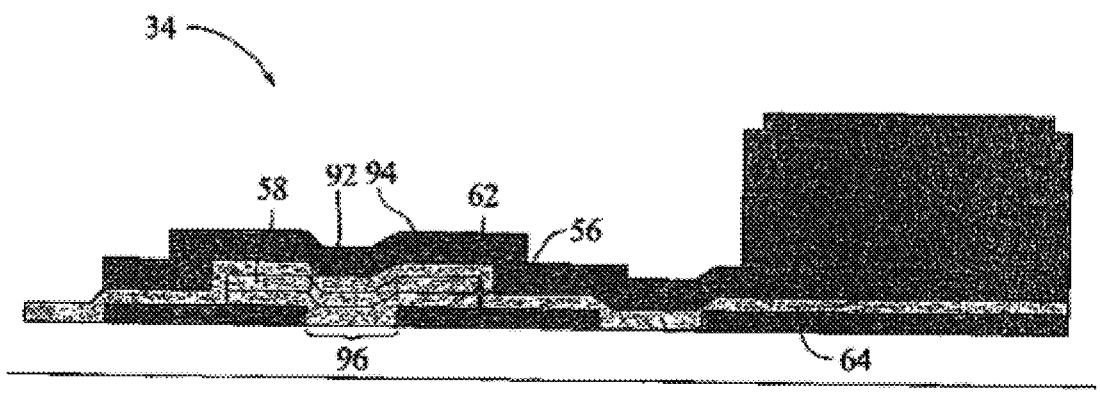
FIG. 6 is a cross-sectional view of a portion of the pixel shown in FIG. 3 during a second subsequent fabrication stage.

FIG. 6 is a cross-sectional view of a portion of pixel 34 shown in FIG. 3 during a second subsequent fabrication stage. During fabrication, second dielectric layer 62 is deposited on first dielectric layer 58. Second dielectric layer 62, such as silicon nitride (SiN), but not limited to SiN, forms storage capacitor dielectric layer 64 and also adds an additional thickness to complete a gate dielectric 92. In one embodiment, second dielectric layer 62 is between approximately 500 Å and approximately 3000 Å thick. In another embodiment, second dielectric layer 62 is approximately 2100 Å thick. Alternatively, second dielectric layer 62 is between approximately 1500 Å and approximately 2500 Å thick. Second dielectric layer 62 facilitates protecting TFT stack 56 during gate metallization and diode etches that follow. Second dielectric layer 62 is not etched at this point.

A first metallic layer 94, which facilitates blocking light from an active TFT region 96, is deposited, in a single metallization step, on second dielectric layer 62. Metallization is a process in which selected elements are contacted and interconnections of a plurality of circuit elements are made. During metallization, a metallic material is deposited by sputtering or is deposited by evaporating a thin layer of a metallic material. Alternatively, the metallic material is deposited other than by sputtering or evaporating. First metallic layer 94 may include, but is not limited to, aluminum, chromium, and/or molybdenum.

Figure 7:
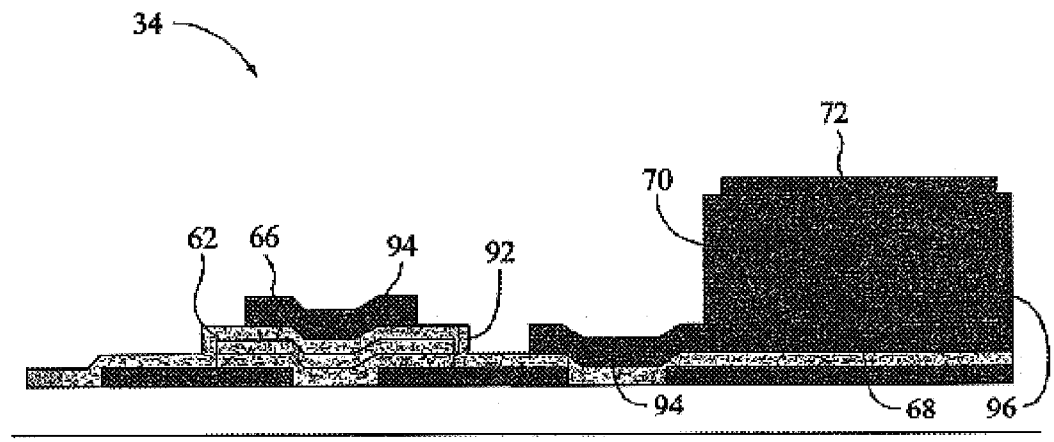
FIG. 7 is a cross-sectional view of a portion of the pixel shown in FIG. 3 during a third subsequent fabrication stage.

FIG. 7 is a cross-sectional view of a portion of pixel 34 shown in FIG. 3 during a third subsequent fabrication stage. During fabrication, first metallic layer 94 is patterned and etched, wherein the etching process stops when second dielectric layer 62 is contacted, to form gate electrode 66 formed unitarily with scan line 32 (shown in FIG. 2) and second capacitor electrode 68. Gate dielectric 92 can also function as an interlayer dielectric that allows gate electrode 66 to be formed unitarily with scan line 32. Second capacitor electrode 68 also functions as a diode bottom contact. Gate electrode 66 and second capacitor electrode 68 may include, but are not limited to, molybdenum, aluminum, and/or chromium, and are deposited in a sputtering process to a thickness of approximately 2000 Å. In one embodiment, scan line 32 is a molybdenum/chromium (Mo/Cr) stack wherein a relatively thin layer of Cr (approximately 300 Å) is an etch stop for reactive ion etching (RIE) diode stack 70. RIE is an etching process that is highly directional and maintains dimensional accuracy.

Following the gate metal etch, diode stack 70 is deposited on second capacitor electrode 68 without any intervening patterning step. Diode top contact 72, formed from a transparent conductor such as ITO, is deposited on diode stack 70. Diode stack 70 is patterned and etched. The same mask may be used to first wet etch, or alternatively, dry etch diode top contact 72, followed by a dry etching of diode stack 70. Alternatively, two separate masking steps can be used to define diode top contact 72, smaller than diode stack 70, followed by patterning and etching diode stack 70.

Figure 8:
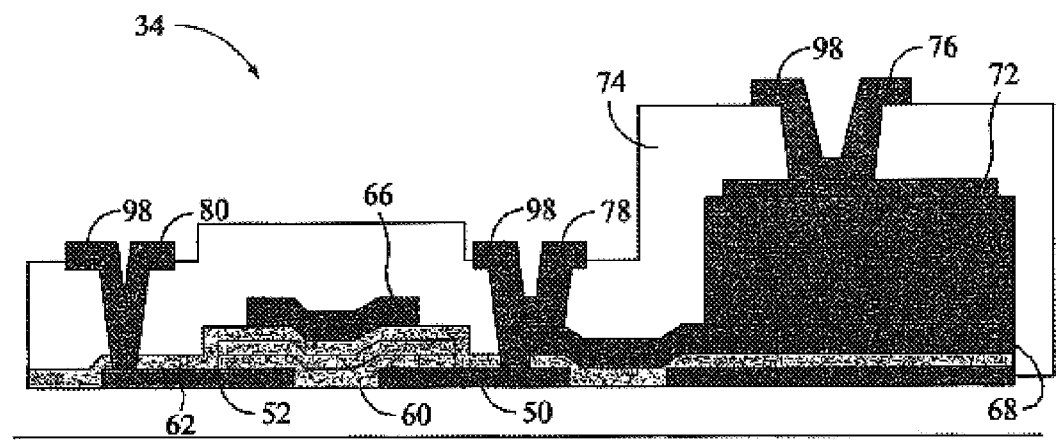
FIG. 8 is a cross-sectional view of a portion of the pixel shown in FIG. 3 during a fourth subsequent fabrication stage.

FIG. 8 is a cross-sectional view of a portion of pixel 34 shown in FIG. 3 during a fourth subsequent fabrication stage. During fabrication, passivation layer 74 is deposited over pixel 34. Passivation layer 74 is etched to expose diode top contact 72, second capacitor electrode 68, source electrode 50, drain electrode 52, and gate electrode 66. Passivation layer 74 is relatively thick, between 0.2 microns ($\mu$) to 1.0$\mu$ and may be formed from material such as, but not limited to, silicon nitride and silicon oxide. Passivation layer 74 facilitates protecting a plurality of diode sidewalls 97 (shown in FIG. 7) against mechanical and chemical damage in subsequent processing. A second metallic layer 98 is deposited on pixel 34 to form common via 76, source via 78, and drain via 80 in passivation layer 74. The source via 78 and drain via 80 are etched through two different thicknesses of dielectric material. Common via 76, source via 78, and drain via 80 are formed in one etching step to provide access through a portion of passivation layer 74 (i.e. common via 76, source via 78, and drain via 80 are surrounded on all sides by remaining portions of common passivation layer 74) such that electrical contact can be made to underlying components.

In an exemplary embodiment, pixel 34 can be fabricated in the processing steps described herein, and allows aluminum metallization, which is desirable for low resistance lines. Metallic gate 66 does not contact a-Si layer 60 directly so no special processes or barrier metal is used in the process. Further, second metallic layer 98 forms data line 30 (shown in FIG. 2) and common electrode 76, and can be formed from aluminum. Second metallic layer 98 is also not in contact with a-Si layer 60 such that no special processes or barrier metal is required. Also, no high temperature processes follows the aluminum deposition process, reducing the chance of forming aluminum hillocks (not shown), which may cause shorts. Finally, a barrier dielectric layer (not shown) is deposited over pixel 34, patterned and etched, to expose contact pads (not shown). The barrier dielectric layer may include, but is not limited to silicon nitride.

Inverting the TFT structure to form a top gate staggered structure as describe herein facilitates blocking light from the active TFT regions since the gate metal serves as both the gate of the TFT and also as a light blocking layer for the channel region.

While the invention has been described in terms of various specific embodiments, those skilled in the art will recognize that the invention can be practiced with modification within the spirit and scope of the claims.

What is claimed is:

1. A radiation detector comprising:
a top gate thin film transistor (TFT) comprising a source electrode, a drain electrode, a gate electrode, a first dielectric layer formed between said source electrode and said gate electrode, and a second dielectric layer, said second dielectric layer extending over a surface of said first dielectric layer, said gate electrode extending over a surface of said second dielectric layer; and
a capacitor comprising at least two electrodes and a dielectric layer, said capacitor dielectric layer formed unitarily with said TFT second dielectric layer.

2. A radiation detector in accordance with claim 1 wherein said radiation detector further comprises a diode electrically coupled to said capacitor, said diode comprising a diode stack, and a diode top contact.

3. A radiation detector in accordance with claim 2 wherein said TFT further comprises a source via electrically coupled to said source electrode, a common via electrically coupled to said diode top contact, and a drain via electrically coupled to said drain electrode.

4. A radiation detector in accordance with claim 3 wherein said drain via and a data line are formed unitarily.

5. A radiation detector in accordance with claim 3 wherein said common via and a common line are formed unitarily.

6. A radiation detector in accordance with claim 2 wherein said source electrode, said drain electrode, at least one of said capacitor electrodes, and said diode top contact comprises indium tin oxide (ITO).

7. A radiation detector in accordance with claim 6 wherein said source electrode and said drain electrode further comprise phosphine plasma.

8. A radiation detector in accordance with claim 2 where said diode stack electrically contacts at least one capacitor electrode.

9. A radiation detector in accordance with claim 1 wherein said gate electrode and a scan line are formed unitarily.

10. A radiation detector in accordance with claim 1 wherein said radiation detector further comprises an amorphous silicon layer, said first dielectric layer extending over a surface of said amorphous silicon layer.

11. A radiation detector in accordance with claim 10 wherein said amorphous silicon layer is approximately 400 angstroms (Å), said first dielectric layer is approximately 400 Å, and said second dielectric layer is approximately 2100 Å.

12. A radiation detector in accordance with claim 1 wherein said second dielectric layer is substantially thicker than said first dielectric layer.

13. A radiation detector in accordance with claim 1 wherein said first dielectric layer and said second dielectric layer comprise silicon nitride.

14. A radiation detector comprising:
a top gate thin film transistor (TFT) comprising a source electrode, a drain electrode, a gate electrode, an amorphous silicon layer, a first dielectric layer approximately 400 angstroms (Å) thick, a second dielectric layer approximately 21 Å thick, said second dielectric layer extending over a surface of said first dielectric layer;

a capacitor comprising a first electrode, a second electrode, and a dielectric layer, said capacitor dielectric layer formed unitarily with said TFT second dielectric layer, and wherein said source electrode, said drain electrode, and at least one of said capacitor electrodes comprise Indium Tin Oxide, and wherein said first dielectric layer and said second dielectric layer comprise silicon nitride;

a diode electrically coupled to said capacitor, said diode comprising a diode stack, and a diode top contact;

a data line formed unitarily with a drain via, said drain via electrically coupled to said drain electrode;

a scan line formed unitarily with said gate electrode; and a common line formed unitarily with a common via, said common via electrically coupled to said diode top contact.

15. A method for fabricating a radiation detector comprising:

forming a top gate thin film transistor (TFT) comprising a source electrode, a drain electrode, a gate electrode, a first dielectric layer between the source electrode and the gate electrode, and a second dielectric layer, the second dielectric layer extending over a surface of said first dielectric layer, the gate electrode extending over a surface of the second dielectric layer; and forming a capacitor comprising at least two electrodes and a dielectric layer, the capacitor dielectric layer formed unitarily with the TFT second dielectric layer.

16. A method in accordance with claim 15 wherein said forming the radiation detector further comprises forming the radiation detector with a diode electrically coupled to the capacitor, wherein the diode comprises a diode stack and a diode top contact.

17. A method in accordance with claim 16 wherein said fabricating the radiation detector further comprises forming the radiation detector with a source via electrically coupled to the source electrode, a common via electrically coupled to the diode top contact, and a drain via electrically coupled to the drain electrode.

18. A method in accordance with claim 17 wherein said forming the drain via comprises forming the drain via unitarily with a data line.

19. A method in accordance with claim 17 wherein said forming the common via comprises forming the common via unitarily with a common line.

20. A method in accordance with claim 16 wherein said forming the source electrode, drain electrode, at least one capacitor electrode, and the diode top contact further comprises, forming the source electrode, the drain electrode, at least one capacitor electrode, and diode top contact with indium tin oxide.

21. A method in accordance with claim 20 wherein said forming the source electrode and the drain electrode with indium tin oxide further comprises selectively treating the source electrode and the drain electrode with phosphine plasma.

22. A method in accordance with claim 16 wherein said method for fabricating a radiation detector further comprises forming a diode stack such that the diode stack electrically contacts at least one capacitor electrode.

23. A method in accordance with claim 16 further comprising:

depositing a passivating dielectric layer on the diode stack, the TFT, and at least one capacitor electrode;

etching the passivating dielectric layer; and depositing and patterning a metallic layer to form the source via, the drain via, and the common via.

24. A method in accordance with claim 15 wherein said forming the gate electrode further comprises forming the gate electrode unitarily with a scan line.

25. A method in accordance with claim 15 wherein said fabricating a radiation detector further comprises forming an amorphous silicon layer, wherein the first dielectric layer is extending over a surface of the amorphous silicon layer.

26. A method in accordance with claim 25 wherein said forming the first dielectric layer and the second dielectric layer further comprises forming the first dielectric layer and the second dielectric layer from a silicon nitride material.

27. A method in accordance with claim 15 wherein said forming the first dielectric layer and the second dielectric layer further comprises forming the second dielectric layer thicker than the first dielectric layer.

28. A method in accordance with claim 27 wherein said forming the first dielectric layer and the second dielectric layer further comprises forming the amorphous silicon layer approximately 400 angstroms (Å) thick, the first dielectric layer approximately 400 Å thick, and the second dielectric layer approximately 2100 Å thick.

29. A method in accordance with claim 15 wherein said forming the source electrode, the drain electrode, and at least one capacitor electrode further comprises forming the source electrode, the drain electrode, and at least one capacitor electrode in a single metallization.

30. A method in accordance with claim 15 wherein said forming the gate electrode and at least one capacitor electrode comprises forming the gate electrode and at least one capacitor electrode in a single metallization.

31. A method for fabricating a radiation detector comprising:

forming a top gate thin film transistor (TFT) comprising a source electrode, a drain electrode, a gate electrode, a first dielectric layer, and a second dielectric layer, the second dielectric layer extending over a surface of the first dielectric layer, and wherein the first dielectric layer and the second dielectric layer comprise silicon nitride;

forming an amorphous silicon layer, wherein the first dielectric layer is extending over a surface of the amorphous silicon layer, the gate electrode is extending over a surface of the second dielectric layer and the second dielectric layer is thicker than the first dielectric layer;

forming a capacitor comprising at least two electrodes and a dielectric layer, said capacitor dielectric layer formed unitarily with said TFT second dielectric layer;

forming a diode electrically coupled to the capacitor, the diode comprising a diode stack and a diode top contact;

forming a drain via formed unitarily with a data line, the drain via electrically coupled to the drain electrode;

forming the gate electrode formed unitarily with a scan line; and forming a common via formed unitarily with a common line, the common via electrically coupled to the drain electrode.

32. An imaging system comprising a radiation source, and a radiation detector, wherein said radiation detector comprises:

a top gate thin film transistor (TFT) comprising a source electrode, a drain electrode, a gate electrode, a first dielectric layer formed between said source electrode and said gate electrode, and a second dielectric layer, said second dielectric layer extending over a surface of said first dielectric layer, said gate electrode extending over a surface of said second dielectric layer; and a capacitor comprising at least two electrodes and a dielectric layer, said capacitor dielectric layer formed unitarily with said TFT second dielectric layer.

33. An imaging system in accordance with claim 32 wherein said radiation detector further comprises a diode electrically coupled to said capacitor, said diode comprising a diode stack, and a diode top contact.

34. An imaging system in accordance with claim 33 wherein said TFT further comprises a source via electrically coupled to said source electrode, a common via electrically coupled to said diode top contact, and a drain via electrically coupled to said drain electrode.

35. An imaging system in accordance with claim 34 wherein said drain via and a data line are formed unitarily.

36. An imaging system in accordance with claim 34 wherein said common via and a common line are formed unitarily.

37. An imaging system in accordance with claim 33 wherein said source electrode, said drain electrode, at least one of said capacitor electrodes, and said diode top contact comprises indium tin oxide (ITO).

38. An imaging system in accordance with claim 37 wherein said source electrode and said drain electrode further comprise phosphine plasma.

39. An imaging system in accordance with claim 33 where said diode stack electrically contacts at least one capacitor electrode.

40. An imaging system in accordance with claim 32 wherein said gate electrode and a scan line are formed unitarily.

41. An imaging system in accordance with claim 32 wherein said radiation detector further comprises an amorphous silicon layer, said first dielectric layer extending over a surface of said amorphous silicon layer.

42. An imaging system in accordance with claim 41 wherein said amorphous silicon layer is approximately 400 angstroms (Å), said first dielectric layer is approximately 400 Å, and said second dielectric layer is approximately 2100 Å.

43. An imaging system in accordance with claim 32 wherein said second dielectric layer is substantially thicker than said first dielectric layer.

44. An imaging system in accordance with claim 32 wherein said first dielectric layer and said second dielectric layer comprise silicon nitride.

45. An imaging system comprising a radiation source, and a radiation detector, wherein said radiation detector comprises:

a top gate thin film transistor (TFT) comprising a source electrode, a drain electrode, a gate electrode, an amorphous silicon layer, a first dielectric layer approximately 400 angstroms (Å) thick, a second dielectric layer approximately 2100 Å thick, said second dielectric layer extending over a surface of said first dielectric layer;

a capacitor comprising a first electrode, a second electrode, and a dielectric layer, said capacitor dielectric layer formed unitarily with said TFT second dielectric layer, and wherein said source electrode, said drain electrode, and at least one of said capacitor electrodes comprise Indium Tin Oxide, and wherein said first dielectric layer and said second dielectric layer comprise silicon nitride;

a diode electrically coupled to said capacitor, said diode comprising a diode stack, and a diode top contact;

a data line formed unitarily with a drain via, said drain via electrically coupled to said drain electrode;

a scan line formed unitarily with said gate electrode; and a common line formed unitarily with a common via, said common via electrically coupled to said diode top contact.

* * * * *

UNITED STATES PATENT AND TRADEMARK OFFICE
CERTIFICATE OF CORRECTION

PATENT NO. : 6,740,884 B2
DATED : May 25, 2004
INVENTOR(S) : Lee et al.

It is certified that error appears in the above-identified patent and that said Letters Patent is hereby corrected as shown below:

Column 7,
Line 3, delete "21" and insert therefor -- 2100 --.

Signed and Sealed this

Twenty-third Day of August, 2005

JON W. DUDAS
*Director of the United States Patent and Trademark Office*